(12) United States Patent  (10) Patent No.: US 8,586,990 B2
Yang et al.  (45) Date of Patent: Nov. 19, 2013

(54) METHOD OF FABRICATING A THIN FILM TRANSISTOR ARRAY SUBSTRATE

(75) Inventors: Dong-Ju Yang, Seoul (KR); Yu Gwang Jeong, Yongin-si (KR); Ki-Yeup Lee, Seoul (KR); Sang-Gab Kim, Seoul (KR); Yun-Jong Yeo, Seoul (KR); Shin-Il Choi, Seoul (KR); Hong-Kee Chin, Suwon-si (KR); Seung-Ha Choi, Siheung-si (KR); Jung-Suk Bang, Guri-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/210,282

(22) Filed: Aug. 15, 2011

(65) Prior Publication Data

US 2011/0297931 A1 Dec. 8, 2011

Related U.S. Application Data

(62) Division of application No. 12/484,116, filed on Jun. 12, 2009, now Pat. No. 8,017,459.

(30) Foreign Application Priority Data

Dec. 30, 2008 (KR) .................. 10-2008-0136895

(51) Int. Cl.
*H01L 27/14* (2006.01)
(52) U.S. Cl.
USPC .............................. 257/72; 438/149; 438/151

(58) Field of Classification Search
CPC .............. H01L 29/786; H01L 27/3248; H01L 27/1214; H01L 7/1251
USPC ............. 257/72, E51.005, E29.151; 438/149, 438/150, 151
See application file for complete search history.

(56) References Cited

U.S. PATENT DOCUMENTS

| 2005/0130353 A1* | 6/2005 | Yoo et al. ....................... 438/151 |
| 2007/0020825 A1* | 1/2007 | Cho et al. ....................... 438/151 |
| 2007/0082434 A1 | 4/2007 | Bae et al. |
| 2007/0221945 A1* | 9/2007 | Honda .......................... 257/102 |
| 2008/0042132 A1* | 2/2008 | Shih et al. ....................... 257/59 |

* cited by examiner

*Primary Examiner* — Khiem D Nguyen
(74) *Attorney, Agent, or Firm* — Innovation Counsel LLP

(57) ABSTRACT

A method of fabricating a thin film transistor array substrate is presented. The method entails forming a gate interconnection line on an insulating substrate, forming a gate insulating layer on the gate interconnection line, forming a semiconductor layer and a data interconnection line on the semiconductor layer, sequentially forming multiple passivation layers, etching the passivation layers down to a drain electrode that is an extension of the data interconnection line. The portion of the drain electrode that is exposed at this stage is a part of the drain electrode-pixel electrode contact portion. A pixel electrode is formed connected to the drain electrode. Two of the passivation layers have the same composition but are processed at different temperatures. A thin film transistor prepared in the above manner is also presented.

7 Claims, 22 Drawing Sheets

METHOD OF FABRICATING A THIN FILM TRANSISTOR ARRAY SUBSTRATE

CROSS REFERENCE TO RELATED APPLICATION

This application is a divisional patent application of U.S. patent application Ser. No. 12/484,116, filed on Jun. 12, 2009, now U.S. Pat. No. 8,017,459, which claims priority from and the benefit of Korean Patent Application No. 10-2008-0136895, filed on Dec. 30, 2008, the contents of each of which are incorporated by reference herein in their entireties.

BACKGROUND OF THE INVENTION

1. Field of the Invention

The present invention relates to a thin film transistor ("TFT") array substrate and a method of fabricating the same, and more particularly, to a TFT array substrate in which the manufacturing process may be simplified and manufacturing cost may be saved, and a method of fabricating the TFT array substrate.

2. Discussion of the Background

A liquid crystal display ("LCD") includes two opposing display panels and a liquid crystal layer interposed therebetween. Each display panel may use a transparent insulating substrate as a supporting substrate. A plurality of thin film patterns may be formed on the insulating substrate. A thin film pattern formation includes a material deposition and a mask process. However, a photolithography process may include multiple steps, such as photoresist coating, mask arrangement, exposure, baking, development, and cleaning, thus increasing the entire processing time and the manufacturing cost.

In order to reduce the number of mask processes, a lift-off method has been studied. More specifically, when a passivation film and a pixel electrode are formed on a TFT array substrate, the passivation film is patterned using a photoresist pattern, a conductive material is deposited on the entire surface of the TFT array substrate, and the photoresist pattern and the conductive material thereon are simultaneously removed using a photoresist stripper. The conductive material remaining on the substrate forms a pixel electrode.

The photoresist stripper may contact the sides or bottom of the photoresist pattern to remove the photoresist pattern covered with the conductive material. To prevent a pattern defect due to a residual portion of the photoresist pattern remaining on the substrate, the contact area of the photoresist pattern with the photoresist stripper should be sufficiently large. Specifically, the passivation film under the photoresist pattern should form a sufficiently large undercut under the inner side of the photoresist pattern. However, if the passivation film is over-etched to form such an undercut, an insulating film on a storage electrode may be over-etched and its thickness may become non-uniform, thus causing a reduction in a driving margin. Moreover, a data interconnection line may be damaged by over-etching, and etching of the data interconnection line in a contact area may cause a contact failure.

SUMMARY OF THE INVENTION

This invention provides a TFT array substrate that increases a driving margin and provides a sufficiently large contact area between conductive materials in a contact portion.

The present invention also provides a TFT array substrate that enables easy lift-off and prevents over-etching of a gate insulating layer and damage to a data interconnection line.

Additional features of the invention will be set forth in the description which follows, and in part will be apparent from the description, or may be learned by practice of the invention.

The present invention is a thin film transistor (TFT) array substrate which includes a display area and circumferential area. The TFT includes a gate interconnection line including a gate line and a gate electrode arranged on an insulating substrate, a gate insulating layer covering the gate interconnection line, a semiconductor layer arranged on the gate insulating layer, a data interconnection line including a data line, a source electrode, and a drain electrode arranged on the semiconductor layer, a first passivation film arranged on the data interconnection line and having a contact hole exposing a portion of the drain electrode, and a pixel electrode electrically connected to the drain electrode, wherein a portion of the pixel electrode arranged on the first passivation film corresponds to the transmission area.

The present invention also is a method of fabricating a thin film transistor (TFT) array substrate. The method includes forming a gate interconnection line on an insulating substrate, the gate interconnection line including a gate line and a gate electrode, forming a gate insulating layer on the gate interconnection line, forming a semiconductor layer and a data interconnection line on the semiconductor layer, the data interconnection line including a data line, a source electrode, and a drain electrode, forming a first passivation film on the data interconnection line, forming a second passivation film on the first passivation film with a first temperature range, forming a third passivation film on the second passivation film sequentially with a second temperature range which is different from the first temperature range, exposing a drain electrode corresponding to the contact area with a pixel electrode by etching the third passivation film, the second passivation film, and the first passivation film sequentially, forming a pixel electrode electrically connected to the drain electrode.

The present invention also is a method of fabricating a thin film transistor (TFT) array substrate. The method includes forming a gate interconnection line on an insulating substrate, the gate interconnection line including a gate line and a gate electrode, forming a gate insulating layer on the gate interconnection line, forming a semiconductor layer and a data interconnection line on the semiconductor layer, the data interconnection line including a data line, a source electrode, and a drain electrode, forming a first passivation film on the data interconnection line, forming a second passivation film sequentially on the first passivation film, exposing a drain electrode corresponding to the contact hole by etching the second and first passivation film with dry etching and wet etching, forming a pixel electrode electrically connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 15A, 16A, 17A, 18A, 19A, 20A, and 21A are cross-sectional views showing processing steps of the method of fabricating the TFT array substrate shown in FIG. 2A according to the third exemplary embodiment of the present invention.

FIGS. 15B, 16B, 17B, 18B, 19B, 20B, and 21B are cross-sectional views showing processing steps of the method of fabricating the TFT array substrate shown in FIG. 2B according to the third exemplary embodiment of the present invention.

DETAILED DESCRIPTION OF THE ILLUSTRATED EMBODIMENTS

Figure 1:
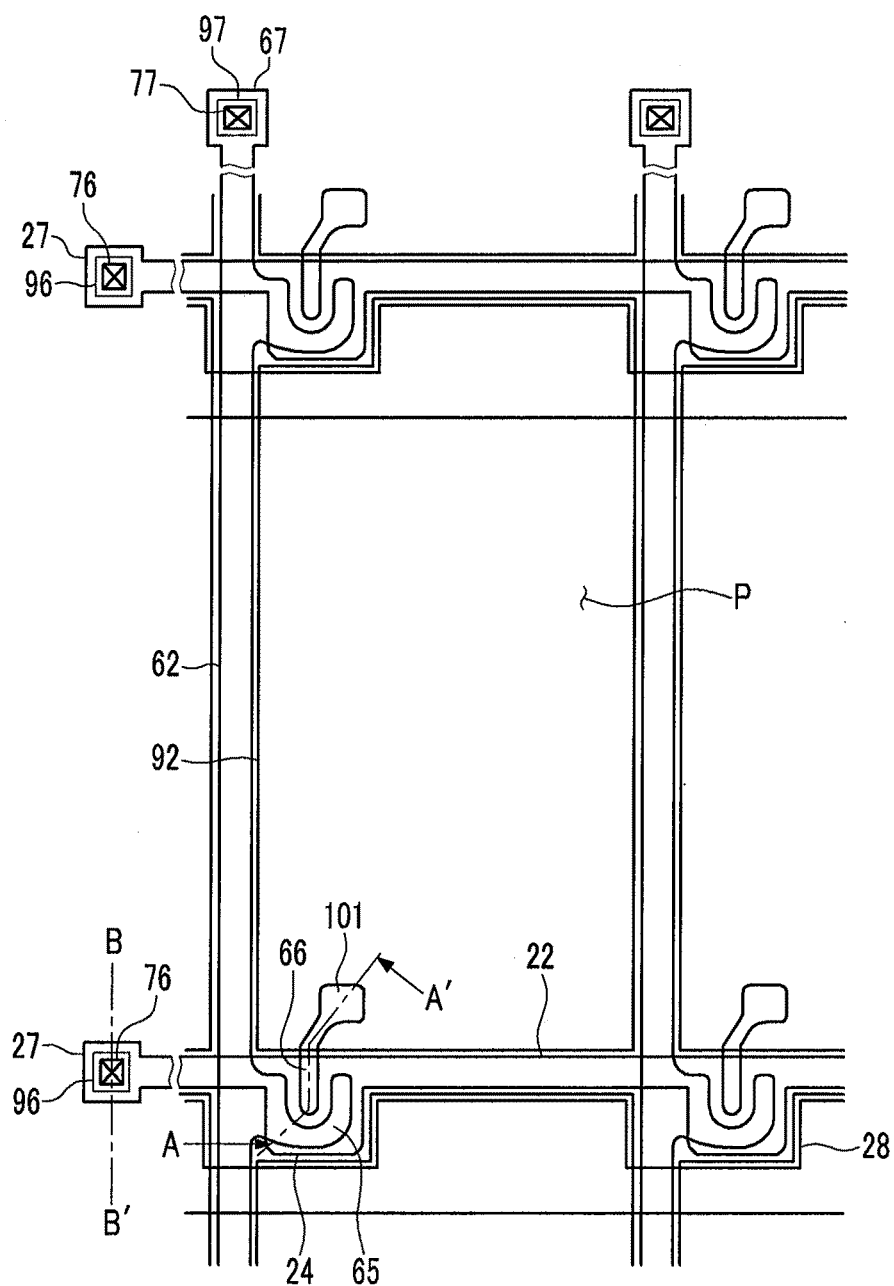
FIG. 1 is a layout of a TFT array substrate according to a first exemplary embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated or reduced for clarity.

In the following description, it will be understood that when an element or a layer is referred to as being "on" or "connected to" another element or layer, it can be directly on or directly connected to the other element or layer, or intervening layers or elements may also be present. In contrast, when an element is referred to as being "directly on" or "directly connected to" another element, there are no intervening elements present. Like reference numerals refer to like elements throughout the specification. The terms "and/or" comprises each and at least one combination of referenced items.

Spatially relative terms, such as "beneath," "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, a TFT array substrate according to the exemplary embodiments of the present invention will be described in detail with reference to the accompanying drawings.

Figure 2A:
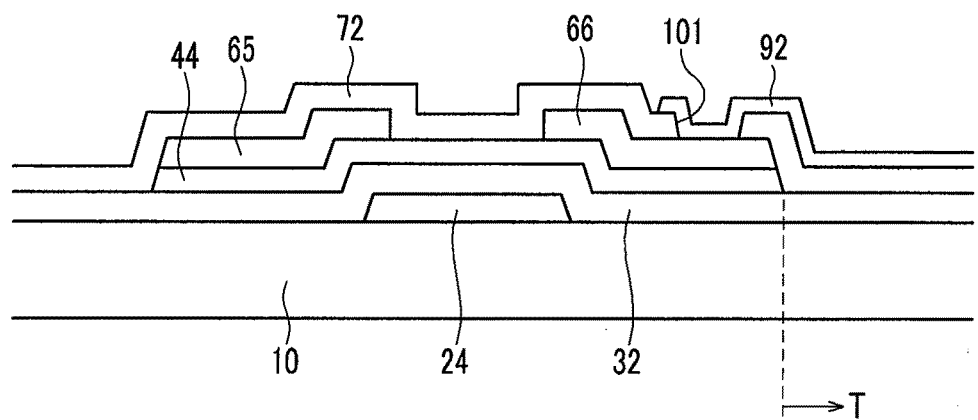
FIG. 2A is a cross-sectional view taken along line A-A' of FIG. 1.
Figure 2B:
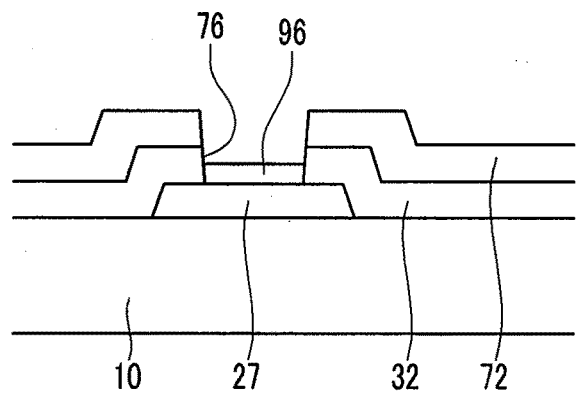
FIG. 2B is a cross-sectional view taken along line B-B' of FIG. 1.

FIG. 1 is a layout of a TFT array substrate according to a first embodiment of the present invention, and FIG. 2A, and FIG. 2B are cross-sectional views taken along lines A-A', and B-B', respectively, of FIG. 1.

A TFT array substrate according to a first exemplary embodiment of the present invention includes a TFT arranged on an insulating substrate and a first passivation film including Silicon Oxide (SiOx) or Silicon Oxynitride (SiON) covering the TFT. The TFT is a three-terminal device including a control terminal, an input terminal, and an output terminal and may include a gate electrode, a source electrode, a drain electrode, and a semiconductor layer. In the TFT, unless otherwise described, the gate electrode may be the control terminal, the source electrode may be the input terminal, and the drain electrode may be the output terminal. The semiconductor layer may form a channel region of the TFT.

Referring to FIG. 1, and FIG. 2, an insulating substrate 10 supports a TFT and may be formed of, for example, transparent glass or plastic. A gate line 22, a gate pad 27, and a gate electrode 24 are arranged on the insulating substrate 10. The TFT array substrate includes a display area (not shown) and a circumferential area (not shown). The display area includes many sub-pixel units (P), and the circumferential area is the area outside of the display area.

Plural gate lines 22 for gate signal transmission are disposed on the insulating substrate 10. The gate lines 22 are spaced apart from each other and extend parallel with each other in a first direction, such as a transverse direction shown in FIG. 1. A gate pad 27 having an expanded width is connected to an end of each gate line 22. In modified embodiments of the invention, although not shown, the gate pad 27 may be arranged at two opposite terminals of the gate line 22, or may not be formed.

The gate electrode 24 is connected to the gate line 22. Plural gate electrodes 24 may also be connected to the gate line 22. Each gate electrode 24 may extend out from the gate line 22. Although not shown in the figures, the gate electrode and the gate line can be formed respectively, and they can be electrically connected to each other by a contact hole.

The gate electrode 24, the gate line 22, and the gate pad 27 may be arranged directly on the insulating substrate 10. Throughout this specification, the gate electrode 24, the gate line 22, and the gate pad 27 may be collectively referred to as a gate interconnection line for the convenience of explanation.

The storage electrode 28, which may be formed of the same material as the gate interconnection line, may be arranged directly on the insulating substrate 10. The storage electrode 28 is arranged in the vicinity of the gate line 22 and extends in the first direction parallel to the gate line 22. A storage electrode pad (not shown), which may be similar to the gate pad 27, may be arranged on at least a terminal of the storage electrode 28. The shape of the storage electrode 28 may vary but the invention is not limited to the shape shown in FIG. 1.

The gate interconnection line and the storage electrode 28 may be formed as a single layer and may be formed of aluminum (Al), copper (Cu), silver (Ag), molybdenum (Mo), chrome (Cr), titanium (Ti), tantalum (Ta), Indium-Tin-Oxide (ITO), Indium-Zinc-Oxide (IZO) or alloys thereof, or as a multi-layered structure including combinations of these materials, but the invention is not limited thereto.

The gate insulation layer 32 may be formed of silicon nitride (SiNx) or silicon oxide (SiOx) and may be arranged on the gate interconnection line and the storage electrode 28. The gate insulation layer may be formed as a multi-layer, for example, silicon nitride (SiNx) layer—silicon oxide (SiOx) double gate insulation layer, but the invention is not limited thereto.

A semiconductor layer pattern 44 and ohmic contact layers 52, 55 and 56, which may be formed of silicide or n+ hydrogenated amorphous silicon doped with n-type impurities at high concentration, are arranged on the gate insulating layer 32. In other embodiments of the invention, the semiconductor layer pattern 44 may be an oxide semiconductor, which includes at least one of Indium, Zinc, Gallium, Hafnium, and Titanium. The semiconductor layer pattern 44 is arranged in substantially the same pattern as the data interconnection line, to be described in further detail below, except for the channel region. A channel region of a thin film transistor corresponds to where the semiconductor layer pattern 44 overlaps with the gate electrode 24.

The data line 62, the data pad 67, the source electrode 65, and the drain electrode 66 are arranged on the semiconductor layer pattern 44. The ohmic contact layers may be formed on the semiconductor pattern 44.

Plural data lines 62 may be disposed on the ohmic contact layers or semiconductor layer directly. The data lines 62 are spaced apart from each other and extend parallel with each other in a second direction, such as a longitudinal direction shown in FIG. 1. The data lines 62 cross with the gate lines 22. A data pad 67 having an expanded width is connected to an end of each data line 62. In modified embodiments of the invention, although not shown, the data pad 67 may be arranged at two opposite terminals of the data line 62, or may not be formed.

The source electrode 65 is connected to the data line 62. Plural source electrodes 65 may also be connected to each data line 62. Each source electrode 62 is opposite to and faces a drain electrode 66. The semiconductor layer pattern 44 may be exposed between the source electrode 65 and the drain electrode 66. Throughout this specification, the data line 62, the data pad 67, the source electrode 62, and the drain electrode 66 may be collectively referred to as a data interconnection line for the convenience of explanation.

The data interconnection line may be formed as a single layer of Al, Cu, Ag, Mo, Cr, Ti, Ta, Indium-Tin-Oxide (ITO), Indium-Zinc-Oxide (IZO) or alloys thereof, or as a multi-layered structure including combinations of these materials, but the invention is not limited thereto.

A first passivation film 72 is arranged on the data interconnection line except in an area where the drain electrode 66 contacts the pixel electrode 92, referred to as a drain electrode-pixel electrode contact portion 101, and except in an area where the data pad 67 contacts an auxiliary data pad 97, referred to as a data contact portion 77. The first passivation film 72 is also arranged on the channel region of the exposed semiconductor layer pattern 44. In addition, the first passivation film 72 is arranged on the gate interconnection line except for the gate contact portion 76. Specifically, in an area where the gate interconnection line does not overlap with the data interconnection line, the first passivation film 72 is arranged on the gate insulating layer 32 in a region corresponding to the gate interconnection line. In an area where the gate interconnection line overlaps with the data interconnection line, the first passivation film 72 is arranged on the corresponding data interconnection line. An area where the gate interconnection line overlaps with the data interconnection line may include an area where the gate line 22 and the data line 62 intersect with each other, and in an area where the source electrode 65 and the drain electrode 66 overlap with the gate electrode 24. In the space between the source electrode 65 and the drain electrode 66, which overlaps with the gate electrode 24, the first passivation film 72 is arranged on the semiconductor layer pattern 44.

The first passivation film 72 may be formed of silicon oxide ($SiO_2$) or silicon oxynitride ($SiO_xN_y$). The first passivation film 72 may have a thickness in a range of about 50 Å to about 1500 Å, or in a range of about 100 Å to about 300 Å.

A second passivation film and a third passivation film may be formed during the manufacturing process, and may be eliminated during the pixel electrode depositing process.

The first passivation film 72 may protect lower structures such as the data interconnection line, the semiconductor layer pattern 44, and the gate interconnection line.

In a formation area of the gate pad 27, the gate contact portion 76 is formed through the gate insulating layer 32, the first passivation film. In a formation area of the data pad 67, the data contact portion 77 is formed through the first passivation film 72.

The pixel electrode 92 may be made of a transparent conductive material such as indium tin oxide (ITO) or indium zinc oxide (IZO), or a material having superior reflectivity such as copper (Cu) or silver (Ag) may be arranged on the exposed insulating substrate 10 in the pixel area. The pixel electrode 92 extends to the drain electrode-pixel electrode contact portion 101 and is connected to the drain electrode 66 at the drain electrode-pixel electrode contact portion 101. The pixel electrode 92 is formed on the first passivation layer 72 corresponding to the transmission area (T) of the display area which increases surface uniformity.

The auxiliary gate pad 96 connected to the gate pad 27 is arranged in the formation area of the gate pad 27, and the auxiliary data pad 97 connected to the data pad 67 is arranged in the formation area of the data pad 67. The auxiliary gate pad 96 and the auxiliary data pad 97 may be formed of the same material, which may be the same material used to form the pixel electrode 92.

Hereinafter, a method of fabricating a TFT array substrate according to a second exemplary embodiment of the present invention will be described.

FIGS. 3A, 4A, 5A, 6A, 7A, 8A, 9A, 10A, 11A, 12A and 13A are cross-sectional views showing processing steps of the method of fabricating the TFT array substrate cross-sectional view shown in FIG. 2A according to a second exemplary embodiment of the present invention. FIGS. 3B, 4B, 5B, 6B, 7B, 8B, 9B, 10B, 11B, 12B and 13B are cross-sectional views showing processing steps of the method of fabricating the TFT array substrate cross-sectional view shown in FIG. 2B according to the second exemplary embodiment of the present invention.

Figure 3A:
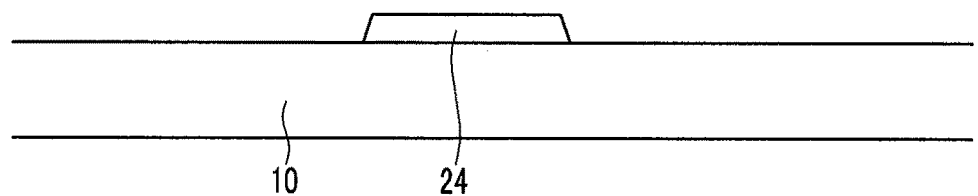
FIGS. 3A, 4A, 5A, 6A, 7A, 8A, 9A, 10A, 11A, 12A and 15A are cross-sectional views showing processing steps of the method of fabricating the TFT array substrate cross-sectional view shown in FIG. 2A according to a second exemplary embodiment of the present invention.
Figure 3B:
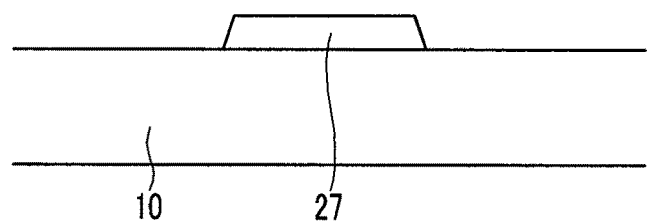
FIGS. 3B, 4B, 5B, 6B, 7B, 8B, 9B, 10B, 11B, 12B and 15B are cross-sectional views showing processing steps of the method of fabricating the TFT array substrate cross-sectional view shown in FIG. 2B according to the second exemplary embodiment of the present invention.

Referring first to FIG. 1, FIG. 3A, and FIG. 3B, the gate interconnection line are formed on the insulating substrate 10. More specifically, a gate conductive layer is deposited on the insulating substrate 10 using, for example, sputtering, and is then photo-etched, thereby forming the gate line 22, the gate pad 27, and the gate electrode 24. The storage electrode and the storage electrode line may be formed respectively with the gate interconnection line or it may be omitted.

Figure 4A:
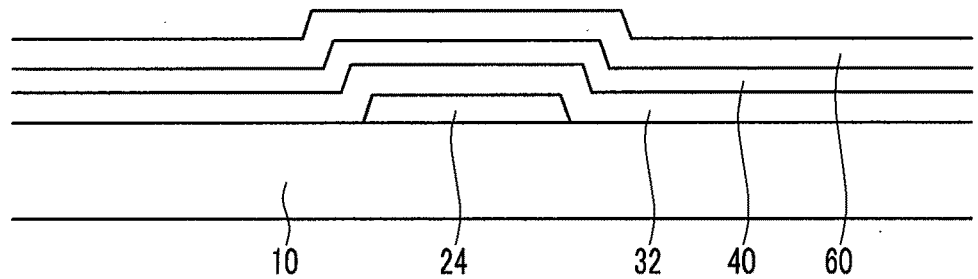
Figure 4B:
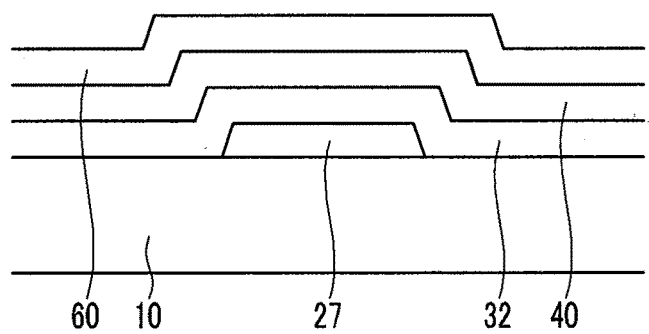

Referring to FIG. 1, FIG. 4A, and FIG. 4B, a gate insulating layer, the oxide semiconductor layer may be deposited instead of the amorphous silicon layer. For example, the oxide semiconductor layer may include at least one of the ZnO, InZnO, InGaO, InSnO, ZnSnO, GaZnO, GaZnSnO, InHfZnO, InTiO, InZnTiO, or ZnTiO. The depositing method, for example, may be sputtering. In case of using an amorphous silicon layer, a first amorphous silicon layer, which may be made of hydrogenated amorphous silicon, and a second amorphous silicon layer, which may be made of silicide or n+ hydrogenated amorphous silicon doped with high concentration n-type impurities, are deposited on the insulating substrate 10. The gate insulating layer 32, the first amorphous silicon layer 40, and the second amorphous silicon layer may be deposited using, for example, chemical vapor deposition (CVD).

Next, a data conductive layer 60 is deposited on the semiconductor layer using, for example, sputtering.

Figure 5A:
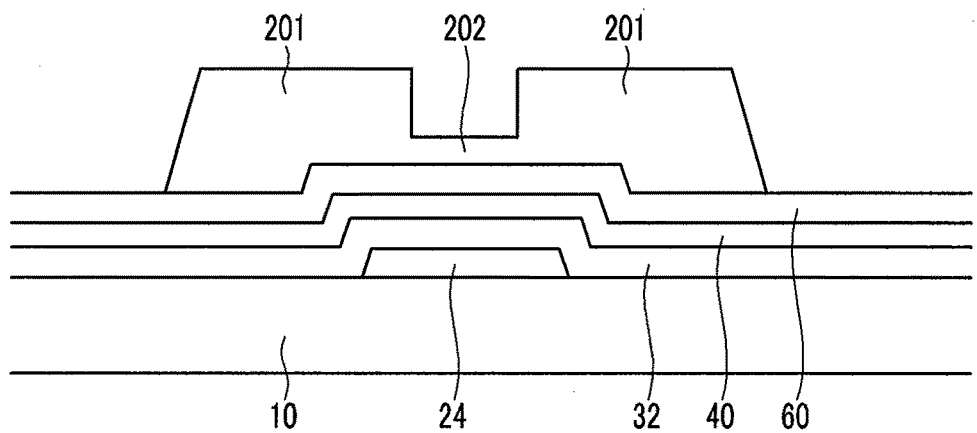
Figure 5B:
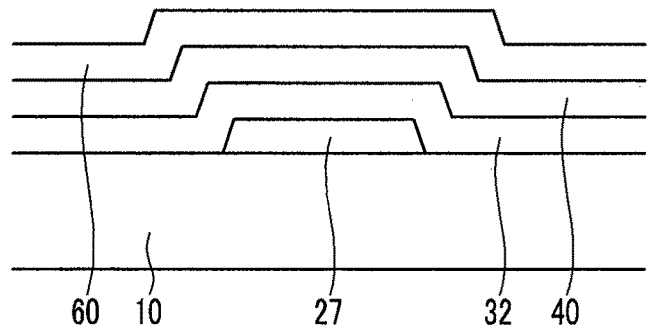

Referring to FIG. 1, FIG. 5A, and FIG. 5B, a photoresist pattern 201 and 202 is formed on the data conductive layer 60. The photoresist pattern includes a first region 201 and a second region 202 having a smaller thickness than the first region 201. The first region 201 covers a formation area of a data line 62, a data pad 67, a source electrode 65, and a drain electrode 66 shown in FIG. 1, FIG. 2A, and FIG. 2B. The second region 202 covers a space between the source electrode 65 and the drain electrode 66. Here, the size of the photoresist pattern 201 and 202 for each region is selected with the consideration that it may be reduced in sized during subsequent etching and ashing processes. The photoresist pattern having different thicknesses for different regions may be formed using a slit mask or a half-tone mask, which can also be applied to other photoresist patterns to be described below.

Figure 6A:
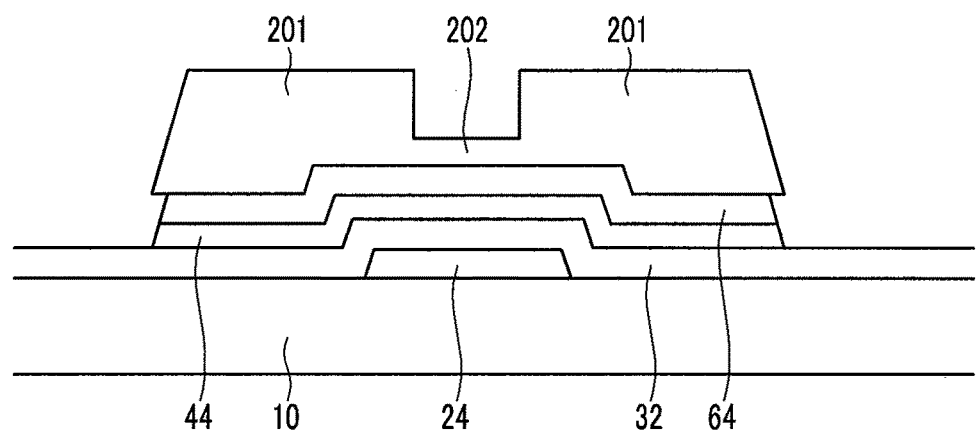
Figure 6B:
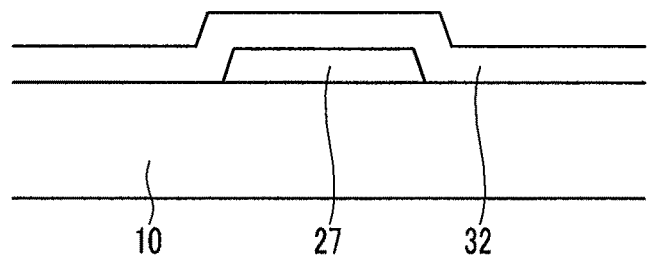

Referring to FIG. 1, FIG. 6A, and FIG. 6B, the exposed data conductive layer 60 is etched using the photoresist pattern 201 and 202 shown in FIG. 5A, and FIG. 5B as an etching mask. The data conductive layer 60 may be etched using one of various methods depending on the required type and thickness of the data conductive layer 60, but may be etched using wet etching. As a result, patterns of the data line 62 and the data pad 67 are formed. However, patterns of the source electrode 65 and the drain electrode 66 are not yet formed and the data conductive layer 64 remains integrated in the channel region.

Once the data conductive layer 60 is etched, oxide semiconductor layer 40 is exposed after etching data interconnection layer 60 and the oxide semiconductor is etched using the data interconnection layer as an etching mask. Dry etching or wet etching may be used for the etching of the oxide semiconductor. In the case of an amorphous silicon layer, the second amorphous silicon layer may be exposed and the exposed second amorphous silicon layer and the first amorphous silicon layer thereunder may be etched. The second amorphous silicon layer and the first amorphous silicon layer may be etched using, for example, dry etching. As a result, a semiconductor layer pattern 44 is formed. In a region where the first amorphous silicon layer or oxide semiconductor layer 40 is etched, the gate insulating layer 32 may be exposed. In this step, the photoresist pattern used as an etching mask is partially etched and thus is reduced in size. The shape of the completed semiconductor layer pattern 44 is substantially the same as those of the data line 62, the data pad 67, and the data conductive layer 64 that is not separated in the channel region.

In the case of an oxide semiconductor layer, once the data conductive layer 60 is etched, the oxide semiconductor layer 40 is exposed; the exposed portion of the oxide semiconductor is etched to form a pattern (44). The oxide semiconductor layer may be etched using, for example, dry etching. In the case of forming an ohmic contact layer, once the data conductive layer 60 is etched, the ohmic contact layer is exposed and the exposed ohmic contact layer and the semiconductor layer thereunder are etched. The ohmic contact layer and the semiconductor layer may be etched using, for example, dry etching.

Figure 7A:
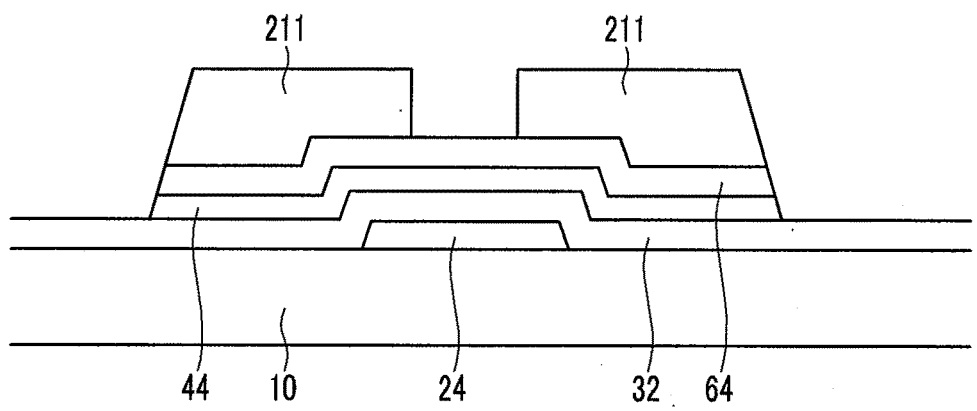
Figure 7B:
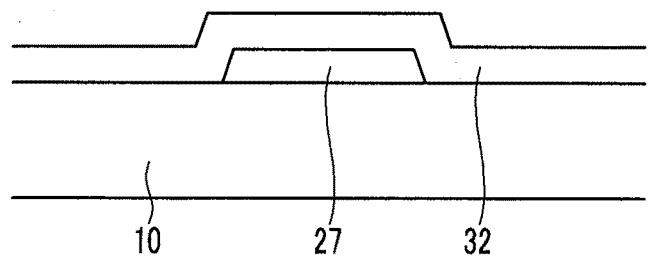

Referring to FIG. 1, FIG. 7A, and FIG. 7B the data conductive layer 64 is exposed by removing the second region 202 of the photoresist pattern. The second region 202 may be removed by an ashing process using $O_2$. At this time, the first region 211 is also reduced in size. In the above-described etching step, the second region 211 may be removed, and in this case, the ashing process may be skipped.

Figure 8A:
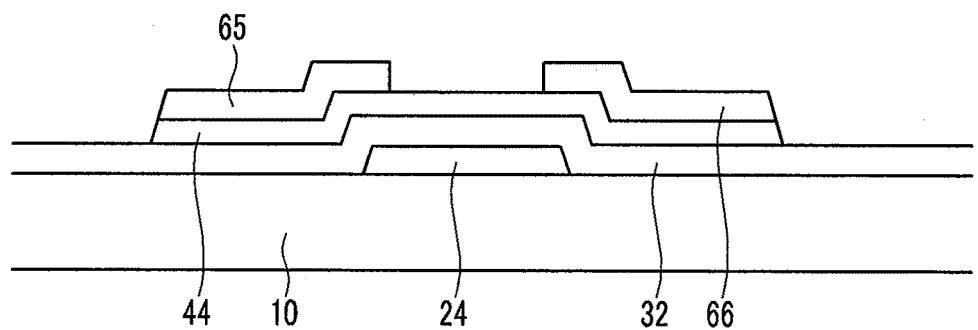
Figure 8B:
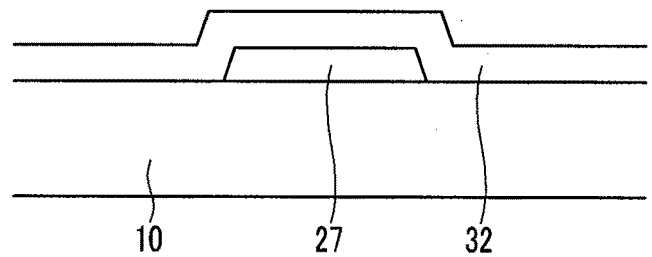

Referring to FIG. 1, FIG. 8A, and FIG. 8B, a region of the exposed data conductive layer corresponding to the channel region is etched using the first region 211 of the down-sized photoresist pattern as an etching mask. As a result, patterns of the source electrode 65 and the drain electrode 66 are formed and the semiconductor layer pattern 44 is exposed in an area where the second amorphous silicon layer 54 is etched. In case of the amorphous silicon layer, the second amorphous silicon layer 54 is exposed through the space between the source electrode 65 and the drain electrode 66. The exposed second amorphous silicon layer 54 is etched to be separated. As a result, ohmic contact layers 52, 55, and 56 are formed.

Figure 9A:
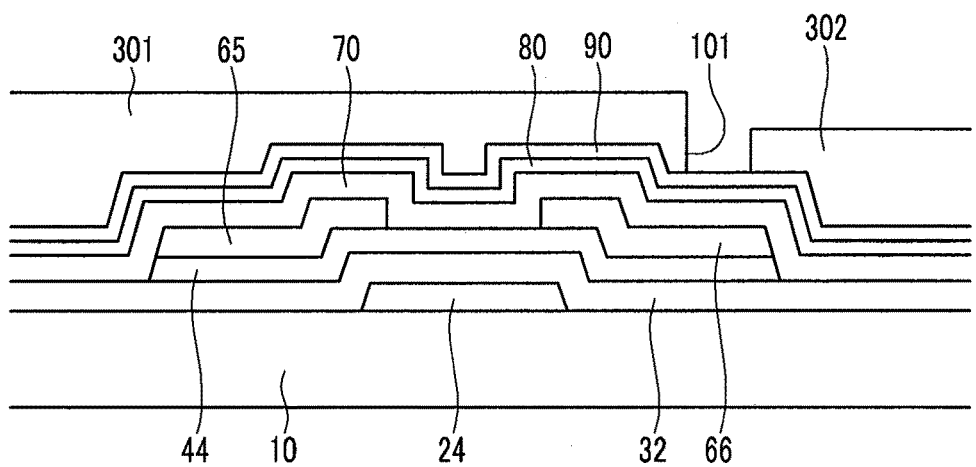
Figure 9B:
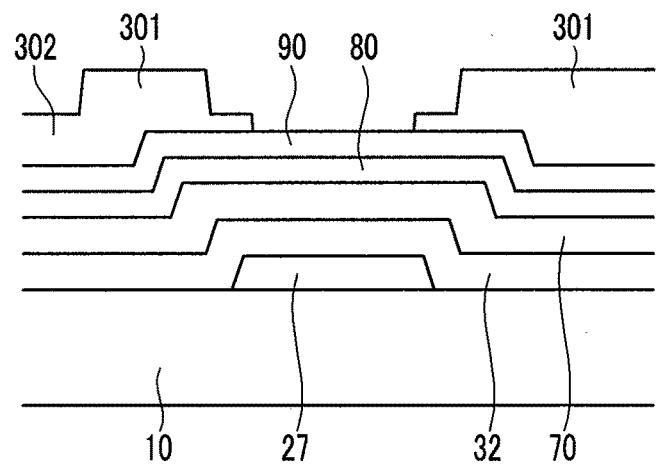

Referring to FIG. 1, FIG. 9A, and FIG. 9B a first insulating layer 70, a second insulating layer 80, and a third insulating layer 90 are sequentially deposited on the TFT array substrate obtained by performing the processing steps illustrated in FIG. 8A, and FIG. 8B using, for example, CVD. The first insulating layer 70 may include silicon oxide (SiOx) or silicon oxynitride (SiON). The second insulating layer 80 and the third insulating layer 90 may include silicon nitride (SiNx). The second insulating layer 80 includes the same component as the third insulating layer, but the process temperature for forming is different from each other. For example, the second insulating layer may be formed with a temperature of 150 degrees and the third insulating layer may be formed with a temperature of 280 degrees which is higher than that of the second insulating layer. The reason for the different process temperature is related to etching rate control between the second insulating layer (80) and the third insulating layer (90). Specifically, the etch rate of the second insulating layer 80 is faster than that of the third insulating layer 90 so that an under-cut in the side surface of the etched second insulating layer 80 may be formed after etching.

Next, a photoresist pattern 301 and 302 is formed on the third insulating layer 90. The photoresist pattern includes a first region 301 and a second region 302 having a smaller thickness than the first region 301. The first region 301 covers a formation area of the gate interconnection line, a formation area of a data interconnection line, and a formation area of the semiconductor layer pattern 44. However, the third insulating layer 90 remains exposed in a formation area of a drain electrode-pixel electrode contact portion 101, an area of the gate pad 27, and an area of the data pad 67.

Figure 10A:
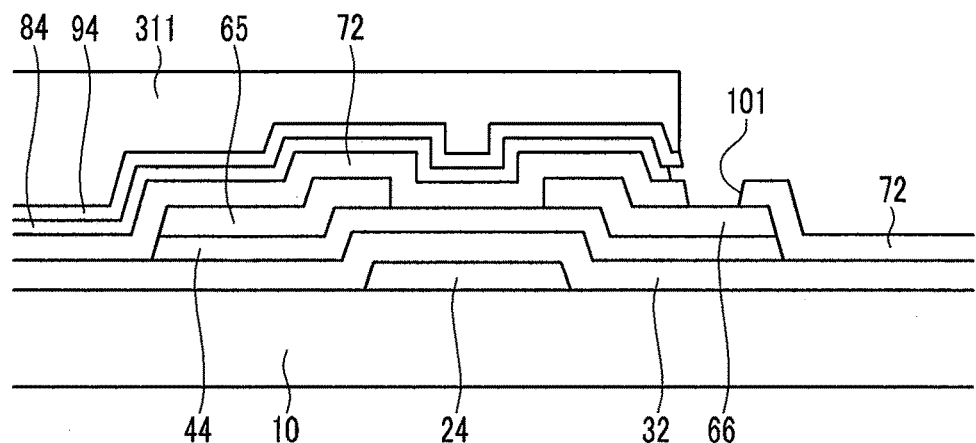
Figure 10B:
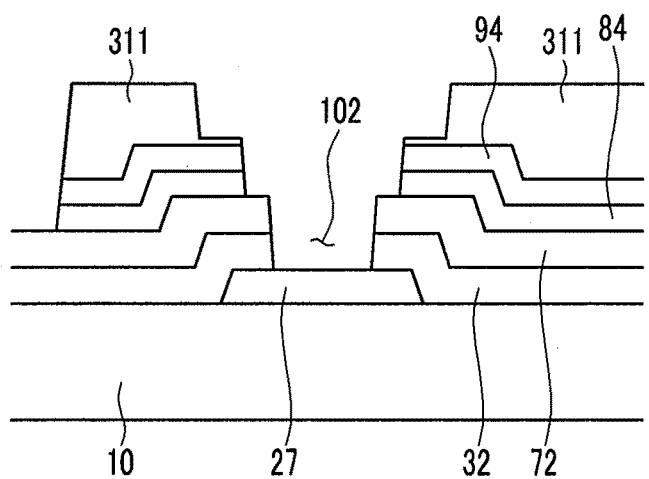

Referring to FIG. 1, FIG. 10A, and FIG. 10B the exposed third insulating layer 90, second insulating layer 80 and the first insulating layer 70 thereunder are etched using the photoresist pattern 311 as an etching mask to form the second passivation film 84 and the first passivation film 72. The photoresist pattern 311 is acquired by etch back process like ashing technology of the photoresist pattern (301). The third insulating layer 90, the second insulating layer 80 and the first insulating layer 70 may be etched using, for example, dry etching. Here, the etching may be anisotropic etching or isotropic etching. In order to secure a lift-off margin using an undercut, isotropic etching may be used. During the etching process, an under-cut is acquired in the side of the etched second insulating layer (84) due to a higher etch rate than that of the third insulating layer (94).

An etching gas to etch the second insulating layer 80 and the third insulating layer 90 may be selected such that the second insulating layer 80 has a large etching selectivity with respect to the third insulating layer 90.

Figure 11A:
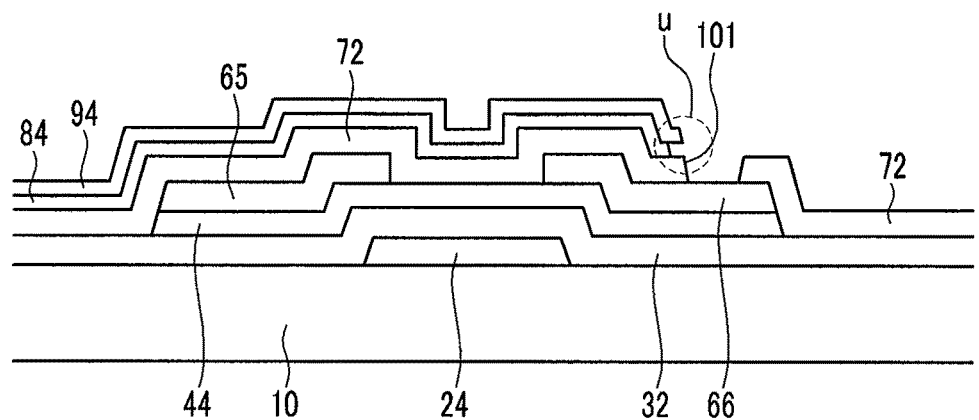
Figure 11B:
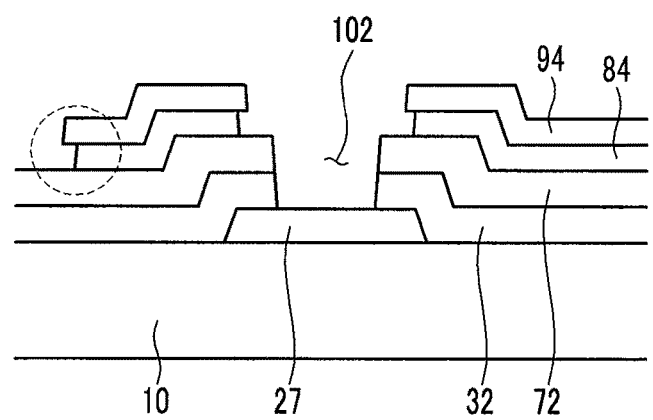

Referring to FIG. 1, FIG. 11A, and FIG. 11B the photo resist pattern is removed by using a stripper. Specifically, the stripper contacts the photoresist by a spraying method or deep-method and dissolves the photoresist to be removed from the third insulating layer. In the 3 mask process, a passivation layer and a pixel electrode are patterned at the same time for a less mask technology. A photoresist lift off process is used normally. But in one embodiment of the invention, to form a passivation and a pixel electrode pattern, the undercut of the second passivation layer is used instead of a photoresist lift off. Referring to FIGS. 11A, and 11B, a vertical view of the side of the silicon nitride having undercut (u) is described. It shows well the silicon nitride layer (84) which is formed in a low temperature process compared to other silicon nitride layer (94) has higher etch rate so that the undercut is formed easily.

Figure 12A:
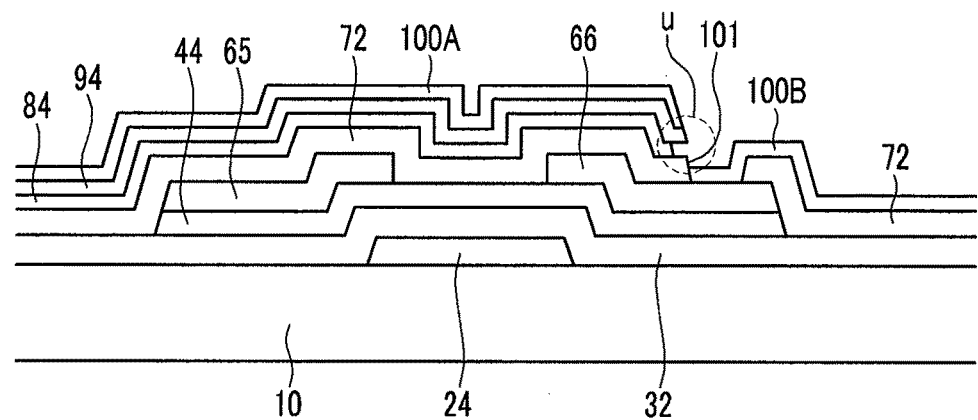
Figure 12B:
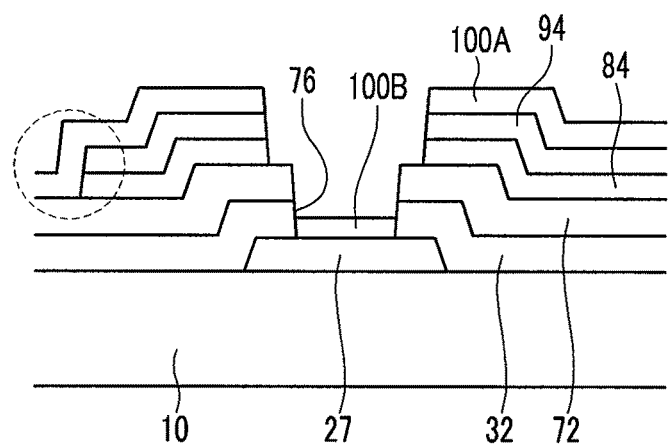

Referring to FIGS. 12A, and 12B, a pixel electrode conductive material is deposited on the entire surface using, for example, sputtering. A portion of the pixel electrode conductive material (100B) is deposited on the first passivation layer 72; another portion of the pixel electrode conductive material (100A) is deposited on the third passivation layer 94 directly. The undercut (U) of the second insulating layer makes discontinuous deposition of the pixel electrode conductive material. After forming the discontinuous pixel electrode conductive layer, the second passivation layer 84 and the third passivation layer 94 which include silicon nitride (SiNx) are etched by using a PE dry etch method. A chemical reaction is the main reaction of the PE mode so that the PE dry etching does not give any influence to the first passivation layer 72 which includes silicon oxide. When the PE dry etch is finished, the pixel electrode layer 100A on the silicon nitride is separated from the substrate. The separated pixel electrode from the substrate is removed using a washing process.

Figure 13:
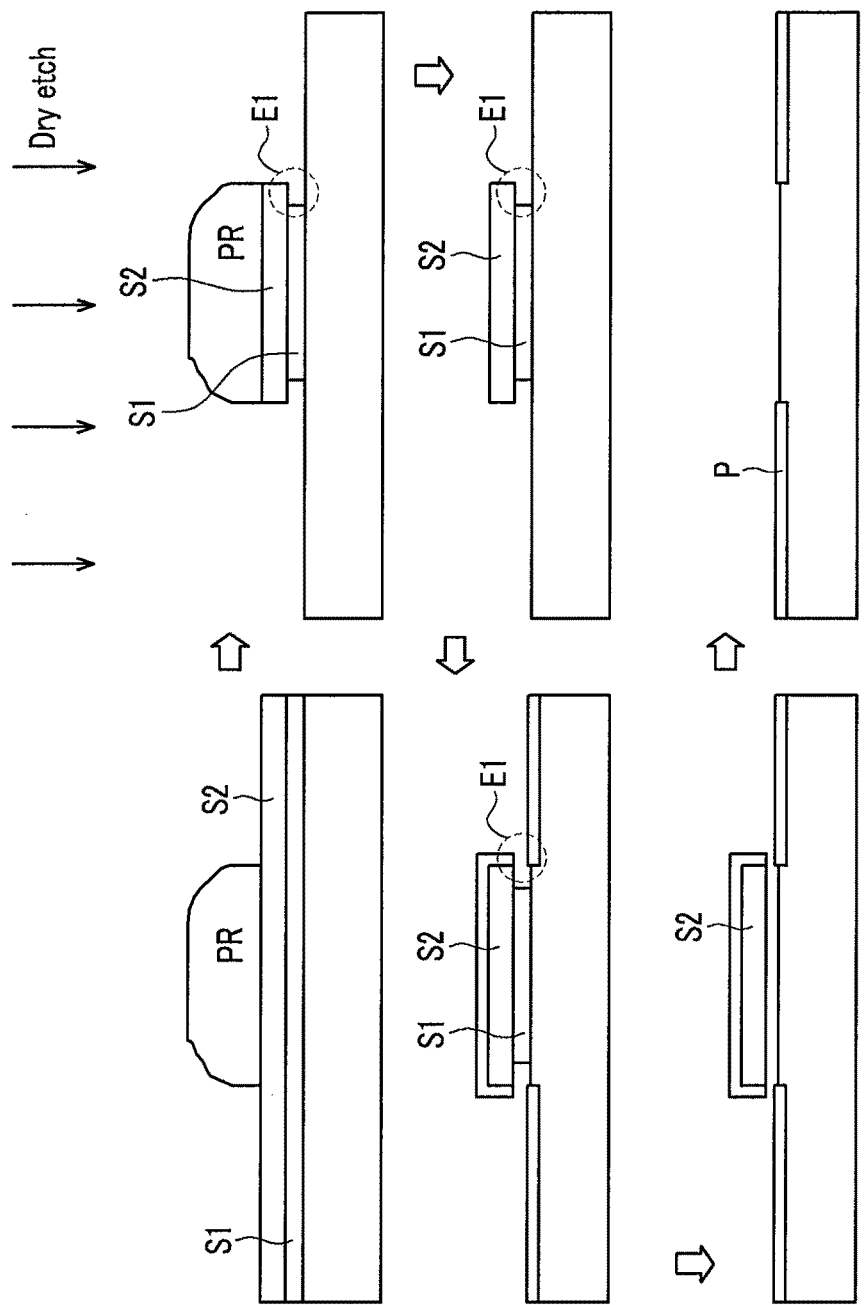
FIG. 13 is an illustration of cross sectional views showing a lift-off processing step in detail.

Referring to FIG. 13-a, first silicon nitride layer (S1) is deposited on the substrate. The process temperature for forming the first silicon nitride layer S1 is about 150 degrees, and the thickness of the first silicon nitride layer S1 is about 2000 Å. After forming the first silicon nitride layer S1, second silicon nitride layer S2 is formed on the first silicon nitride layer S1 at about 280 degrees, and a 2000 Å thickness. A photo resist layer is formed on the second silicon nitride layer S2. The photo resist layer is patterned by an exposure, developing process. Referring to FIG. 13-b, the second silicon nitride layer S2 and the first silicon nitride layer S1 are etched by dry etching using the patterned photoresist layer as an etching mask. After etching, the second silicon nitride layer S2 is found to have an undercut E1 on the side wall. Referring to 13-c, after patterning the first silicon nitride layer S1 and the second silicon nitride layer S2, the residue of the photoresist is removed using a stripper. Referring to 13-d, a transparent electrode layer is deposited with a thickness 450 Å after removing the patterned photoresist. To form the transparent electrode layer, for example, sputtering may be used. Because of the undercut E1, the transparent electrode layer is deposited discontinuously on the side wall of the first silicon nitride layer S1. Referring to FIG. 13-e, a silicon nitride layer is etched by a PE mode dry etching. The transparent electrode layer on the silicon nitride layer is separated from the substrate due to undercut E1. On the contrary, the transparent electrode layer on the substrate is not separated from the substrate. Referring to FIG. 13-f, the fallen off transparent electrode layer on the silicon nitride layer (S2) is removed by a washing process so that the patterned transparent electrode layer (P) is formed. The undercut to form the discontinuous deposition of the transparent electrode is from about 500 Å to about 1500 Å.

Figure 14:
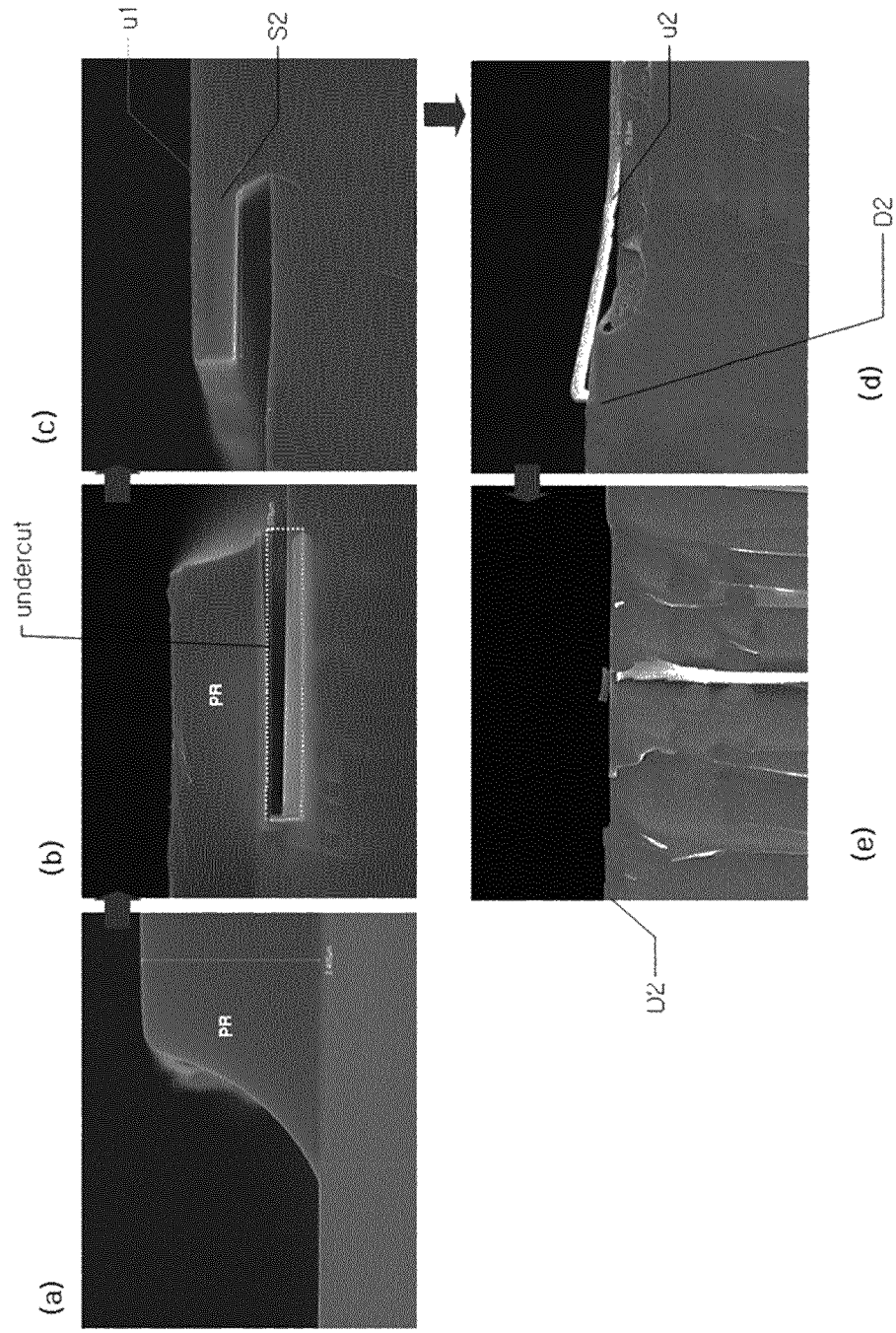
FIG. 14 is an illustration of cross sectional views showing the SEM image of a portion of the TFT array substrate.

FIG. 14 shows an actual vertical image by SEM imaging of each process mentioned above. Referring to FIG. 14-a, first silicon nitride layer is formed on a substrate. The process temperature is about 150 degrees C., and the thickness of the first silicon nitride layer is about 2000 Å. After forming the first silicon nitride layer, a second silicon nitride layer is formed on the first silicon nitride layer at about 280 degrees C., and 2000 Å thickness. A photo resist layer is formed on the second silicon nitride layer. The photoresist layer (PR) is patterned by an exposure, developing process. Referring to FIG. 14-b, a low temperature process silicon nitride layer mentioned in FIG. 13 has a higher etch rate so that the undercut is formed on the wall. In this figure, the low temperature process silicon nitride layer is over etched to make it easy to show the lift off mechanism according to an embodiment of the invention. Referring to FIG. 14-c, due to the undercut, a transparent electrode (u1) on the silicon nitride layer (S2) is separated from the transparent electrode on the substrate. The thickness of the transparent electrode is thinner than that of the silicon nitride layer, so it makes it difficult for the transparent electrode to cover the entire area. The undercut also makes it easier to have a discontinuous deposition of the transparent electrode. In FIG. 14-d, the silicon nitride layer is etched by PE mode dry etching. The transparent electrode (u1) on the silicon nitride layer is fallen off, because the silicon nitride layer is removed by the PE mode dry etching. And the transparent electrode (u2) separated from the substrate is removed through a washing process. Referring to FIG. 14-e, it shows a patterned transparent electrode (d2) on the substrate.

Figure 15A:
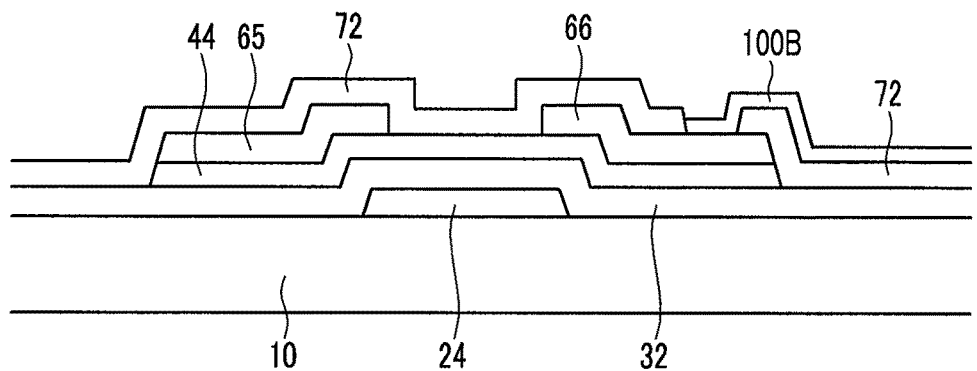
Figure 15B:
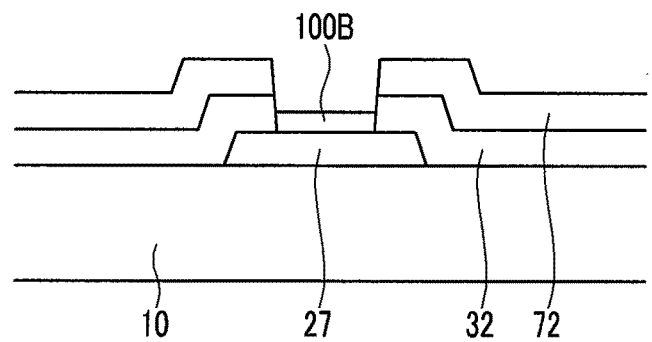

Referring to FIG. 1, FIGS. 15A, and 15B, it shows a vertical view of the thin film transistor after a washing process. The transparent electrode on the silicon nitride layer is separated, and it is removed by a washing process. As a result, a pixel electrode pattern is formed. According to an embodiment of the invention, just 1 mask process is needed to form a passivation pattern and pixel electrode pattern to save from any additional mask processes.

Hereinafter, a method of fabricating a TFT array substrate according to a still another exemplary embodiment of the present invention will be described. In the following description, the same structure and method as in the first embodiment of the present invention described with reference to FIGS. 3A through 15B and FIGS. 2A through 2B will be described in brief and the description will focus on a difference between the other exemplary embodiment of the present invention. FIGS. 16A, 17A, 18A, 19A, 20A, and 21A are cross-sectional views showing processing steps of the method of fabricating the TFT array substrate cross-sectional view shown in FIG. 2A according to the first exemplary embodiment of the invention. FIGS. 16B, 17B, 18B, 19B, 20B, and 21B are cross-sectional views showing processing steps of the method of fabricating the TFT array substrate cross-sectional view shown in FIG. 2B according to the present exemplary embodiment of the present invention.

The method according to the other exemplary embodiment of the present invention includes the same steps of forming patterns of the source electrode 65 and the drain electrode 66, and exposing the semiconductor layer pattern 44 as in the method according to the other embodiment of the present invention.

Figure 16A:
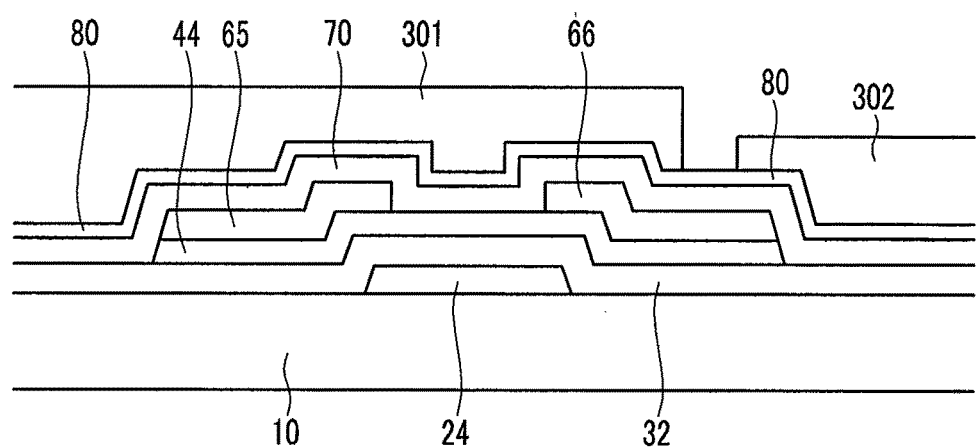
Figure 16B:
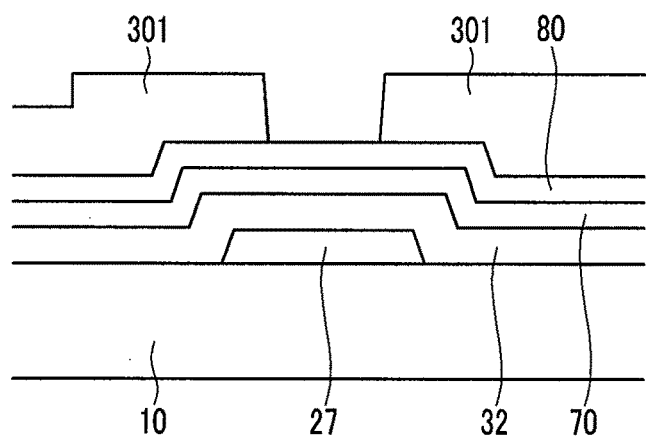

Referring to FIG. 1, FIG. 16A, and FIG. 16B a first insulating layer 70, and a second insulating layer 80 are sequentially deposited on the TFT array substrate obtained by performing the processing steps illustrated in FIG. 8A, and FIG. 8B using, for example, CVD. The first insulating layer 70 may include silicon oxide (SiOx) or silicon oxynitride (SiON). The second insulating layer 80 may include silicon nitride (SiNx).

Next, a photoresist pattern 301 and 302 is formed on the second insulating layer 80. The photoresist pattern includes a first region 301 and a second region 302 having a smaller thickness than the first region 301. The first region 301 covers a formation area of the gate interconnection line, a formation area of a data interconnection line, and a formation area of the semiconductor layer pattern 44. However, the second insulating layer 80 remains exposed in a formation area of a drain electrode-pixel electrode contact portion 101, an area of the gate pad 27, and an area of the data pad 67.

Figure 17A:
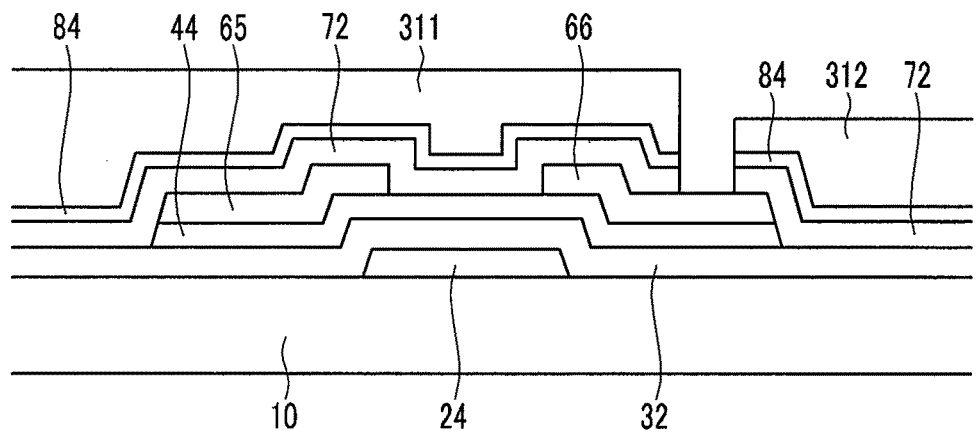
Figure 17B:
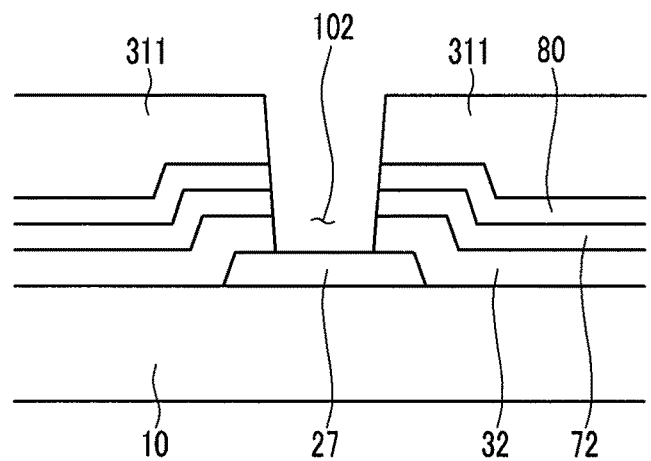

Referring to FIG. 1, FIG. 17A, and FIG. 17B, the exposed second insulating layer 80 and the first insulating layer 70 thereunder are etched using the photoresist pattern 301 as an etching mask to form the second passivation film 84 and the first passivation film 72. The second insulating layer 80 and the first insulating layer 70 may be etched using, for example, dry etching. Here, the etching may be anisotropic etching or isotropic etching.

Figure 18A:
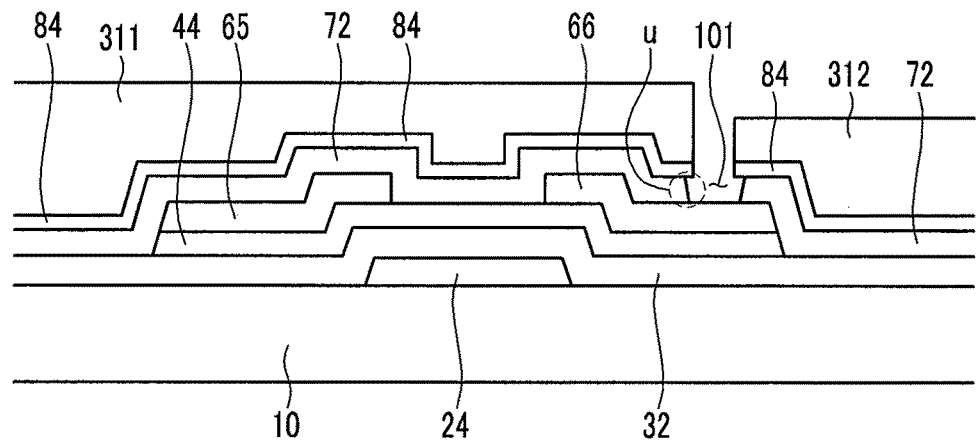
Figure 18B:
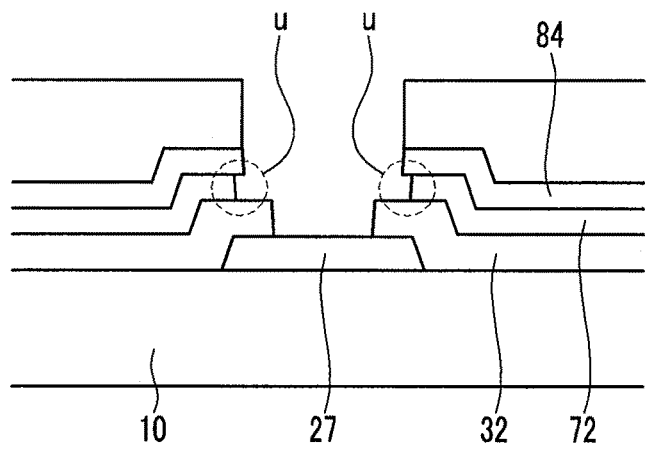

Referring to FIG. 18A, and FIG. 18B, after exposing the drain electrode 66 corresponding to the contact hole 101, an undercut (u) is made in the side of the first insulating layer (74, 74A) by using wet etchant including HF.

Figure 19A:
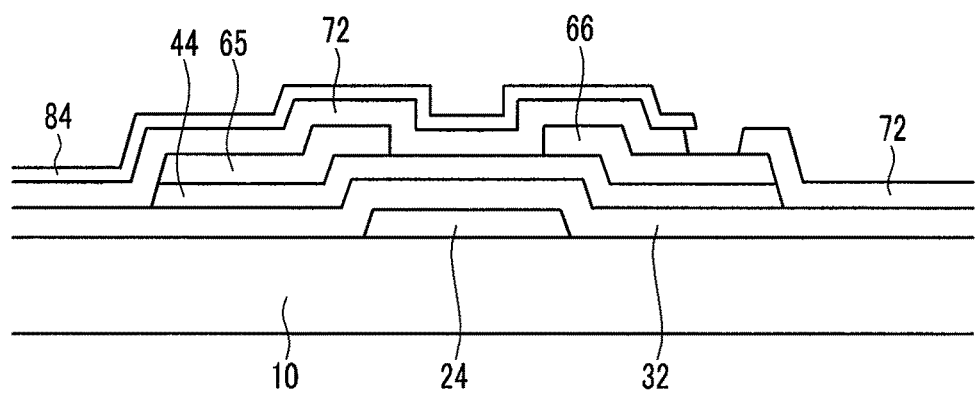
Figure 19B:
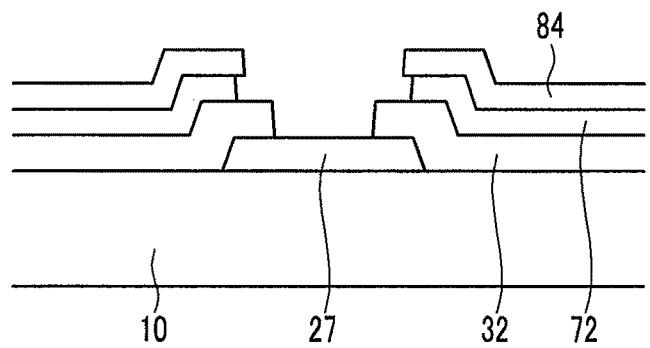

Referring to FIGS. 19A, and 19B, the photo resist pattern is removed by using a stripper. Specifically, the stripper contacts the photoresist using a spraying method or deep-method and dissolving the photoresist to be removed through the second passivation layer 84. In the 3 mask process, a passivation layer and a pixel electrode are patterned at the same time for a less mask technology, and photoresist lift off process is used normally. But in this embodiment of the invention, to form a passivation and a pixel electrode pattern, the undercut of the second passivation layer is used instead of photoresist lift off.

Figure 20A:
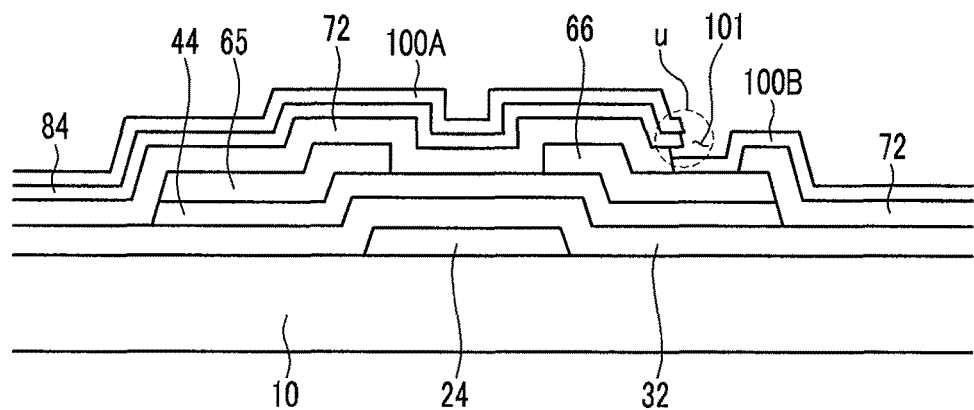
Figure 20B:
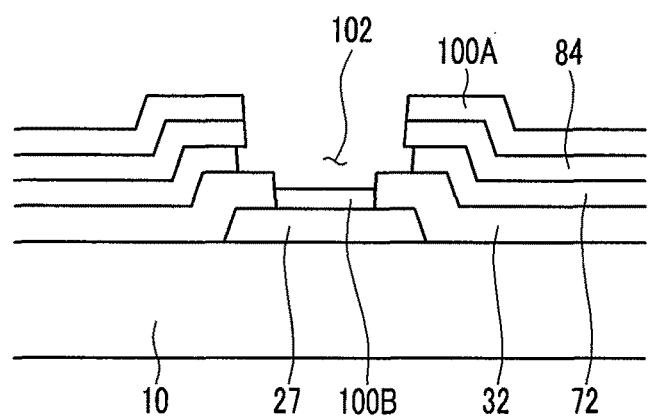

Referring to FIGS. 20A, and 20B, a pixel electrode conductive material is deposited on the entire surface using, for example, sputtering. A portion of the pixel electrode conductive material (100B) is deposited on the first passivation layer 72; another portion of the pixel electrode conductive material (100A) is deposited on the second passivation layer 84 directly. The undercut (u) of the first insulating layer makes a discontinuous deposition of the pixel electrode conductive material. After forming the discontinuous pixel electrode conductive layer, the second passivation layer which includes silicon nitride is etched by using a PE dry etch method. A chemical reaction is the main reaction of the PE mode so that the PE dry etch does not give any influence to the first passivation layer (74A, 74B) which includes silicon oxide. When the PE dry etch is finished, the pixel electrode conductive material (100A) on the silicon nitride is separated from the substrate. The separated pixel electrode from the substrate is removed using a washing process.

Figure 21A:
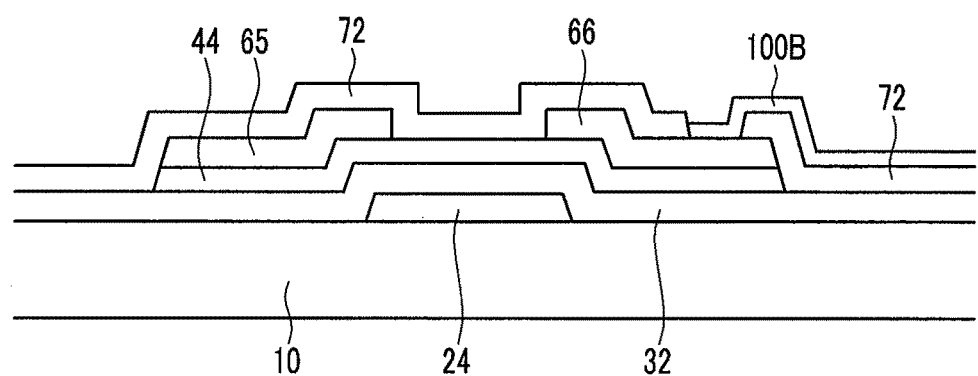
Figure 21B:
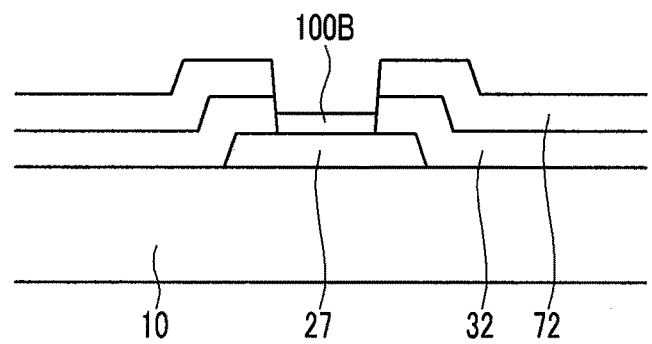

Referring to FIG. 1, FIGS. 21A and 21B, it shows vertical view of the thin film transistor after washing process. The pixel electrode pattern 100B is formed and electrically connected to the drain electrode 44.

Figure 22A:
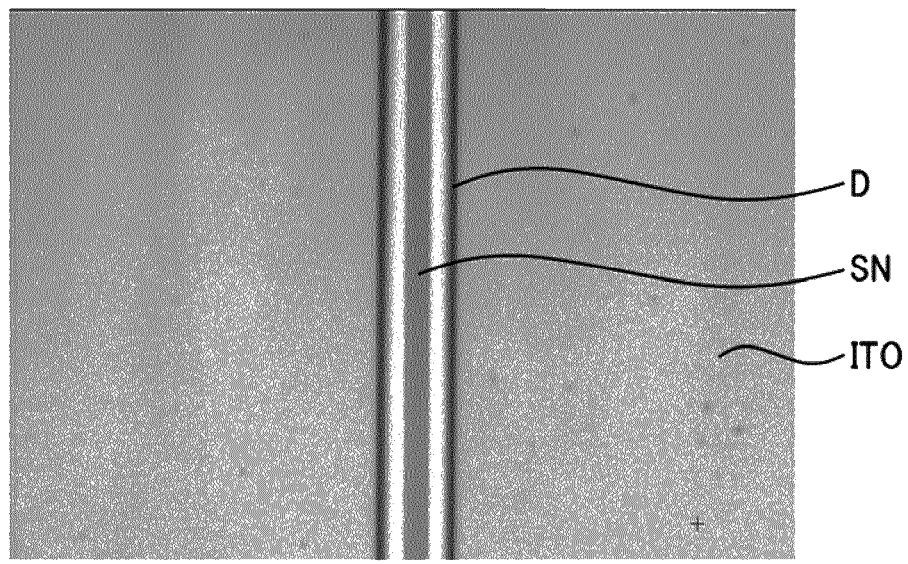
FIGS. 22A and 22B are a plain view of the data interconnection line during the lift off process.
Figure 22B:
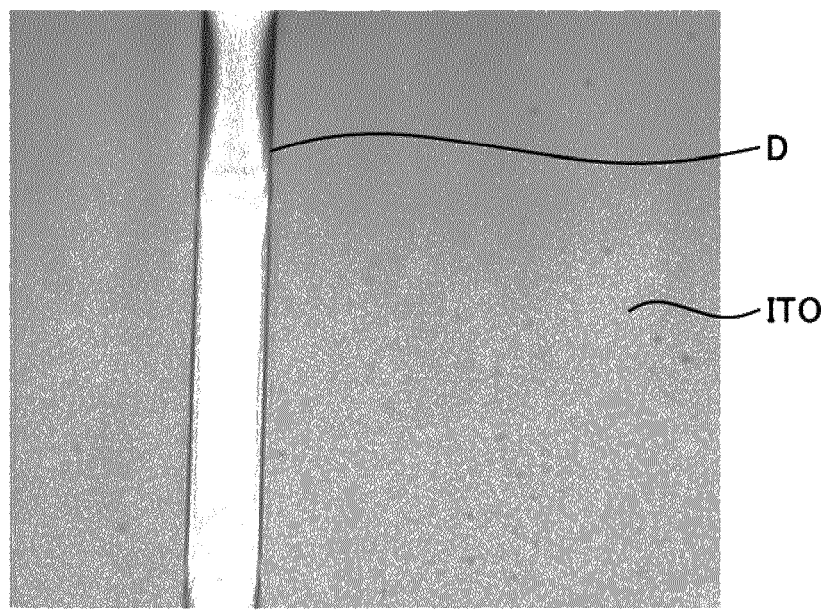

Referring to FIGS. 22A and 22B, they show plain views of the actual image of the process. Referring to FIG. 22A, the line in the middle is a silicon nitride layer (SN) formed on the area corresponding to a data line (D), and indium-tin-oxide (ITO) is formed on the silicon nitride layer. Referring to FIG. 22B, silicon nitride layer is removed by PE dry etching, and the indium-tin-oxide on the silicon nitride layer is separated from substrate.

In the other ways, if we can form an undercut using double passivation layers which etch rate is different from each other, and then we can reduce the number of mask processes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor (TFT) array substrate, comprising;
   a gate interconnection line comprising a gate line, a gate electrode, and a gate pad arranged on an insulating substrate;
   a gate insulating layer arranged on the gate interconnection line;
   a semiconductor layer arranged on the gate insulating layer;
   a data interconnection line comprising a data line, a source electrode, and a drain electrode arranged on the semiconductor layer;
      a first passivation layer arranged on the data interconnection line and having a first contact hole exposing a portion of the drain electrode and comprising silicon oxide or silicon oxy-nitride;
   a second passivation layer arranged on the first passivation layer and comprising silicon nitride;
   a third passivation layer arranged on the second passivation layer and comprising silicon nitride; and
   a pixel electrode electrically connected to the drain electrode through the first contact hole, and formed on the first passivation layer; and
   wherein the pixel electrode is formed at least partially by removing the second passivation layer and the third passivation layer from the insulating substrate, and
   wherein the second passivation layer is formed at a first temperature and comprises an undercut, and the third passivation layer is formed at a second temperature that is higher than the first temperature.

2. The TFT array substrate of claim 1, wherein the semiconductor layer includes an oxide semiconductor including at least one of Hafnium, Zinc, Indium, Gallium, and Tin.

3. The TFT array substrate of claim 1, wherein the gate insulating layer is patterned exposing a portion of a pad and does not contact the pixel electrode in a transmissive area of the array substrate.

4. The TFT array substrate of claim 1, wherein the first temperature is about 150° C.

5. The TFT array substrate of claim 1, wherein the second temperature is about 280° C.

6. The TFT array substrate of claim 1, wherein the second passivation layer has a thickness of about 2000 Å.

7. The TFT array substrate of claim 1, wherein the third passivation layer has a thickness of about 2000 Å.

* * * * *